United States Patent
Ferger et al.

(10) Patent No.: US 9,343,423 B2
(45) Date of Patent: May 17, 2016

(54) NO FLOW UNDERFILL OR WAFER LEVEL UNDERFILL AND SOLDER COLUMNS

(71) Applicants: Claudius Ferger, Armonk, NY (US); Michael A. Gaynes, Armonk, NY (US); Jae-Woong Nah, Armonk, NY (US); Da-Yuan Shih, Armonk, NY (US)

(72) Inventors: Claudius Ferger, Armonk, NY (US); Michael A. Gaynes, Armonk, NY (US); Jae-Woong Nah, Armonk, NY (US); Da-Yuan Shih, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/526,268

(22) Filed: Oct. 28, 2014

(65) Prior Publication Data

US 2015/0147851 A1 May 28, 2015

Related U.S. Application Data

(62) Division of application No. 13/231,594, filed on Sep. 13, 2011, now Pat. No. 8,963,340.

(51) Int. Cl.
*H01L 21/50* (2006.01)
*H01L 21/48* (2006.01)
(Continued)

(52) U.S. Cl.
CPC .............. *H01L 24/81* (2013.01); *H01L 21/463* (2013.01); *H01L 23/49816* (2013.01); *H01L 23/544* (2013.01); *H01L 24/11* (2013.01); *H01L 24/13* (2013.01); *H01L 24/16* (2013.01); *H01L 24/27* (2013.01); *H01L 24/29* (2013.01); *H01L 24/743* (2013.01); *H01L 24/83* (2013.01);
(Continued)

(58) Field of Classification Search
CPC ........ H01L 24/81; H01L 24/11; H01L 21/563
USPC .......................................................... 438/108
See application file for complete search history.

(56) References Cited

U.S. PATENT DOCUMENTS 6,121,689 A * 9/2000 Capote et al. ................. 257/783
6,335,571 B1 1/2002 Capote et al. ................. 257/787
(Continued)

OTHER PUBLICATIONS

Feger, C., et al. The Over-Bump Applied Resin Wafer-Level Underfill Process...; IBM Research Report; RC24851(W0908-142); Aug. 31, 2009; 5 pp.; USA.

*Primary Examiner* — Luan C Thai
(74) *Attorney, Agent, or Firm* — Robert J. Eichelburg; The Law Offices of Robert J. Eichelburg

(57) ABSTRACT

A preassembly semiconductor device comprises chip soldering structures on a semiconductor chip and substrate soldering structures on a substrate corresponding to the chip soldering structures. The substrate soldering structures extend toward the chip soldering structures for forming solder connections with the chip soldering structures. The chip and the substrate are in preassembly positions relative to one another. The height of the substrate soldering structures is greater than the height of the chip soldering structures. A pre-applied underfill is contiguous with the substrate and is sufficiently thick so as to extend substantially no further than the full height of the substrate soldering structures. In another embodiment the height of the chip soldering structures is greater than the height of the substrate soldering structures and the pre-applied underfill is contiguous with the semiconductor chip and sufficiently thick so as to extend substantially no further than the full height of the chip soldering structures. A process comprises manufacturing semiconductor assemblies from these devices by soldering the chip and the substrate to one another.

21 Claims, 11 Drawing Sheets

(51) Int. Cl.
    *H01L 23/00*         (2006.01)
    *H01L 23/498*      (2006.01)
    *H01L 21/463*      (2006.01)
    *H01L 23/544*      (2006.01)

(52) U.S. Cl.
CPC ............... *H01L 24/92* (2013.01); *H01L 24/32* (2013.01); *H01L 24/73* (2013.01); *H01L 2223/54426* (2013.01); *H01L 2223/54473* (2013.01); *H01L 2223/54486* (2013.01); *H01L 2224/11462* (2013.01); *H01L 2224/13082* (2013.01); *H01L 2224/13147* (2013.01); *H01L 2224/1605* (2013.01); *H01L 2224/16225* (2013.01); *H01L 2224/16227* (2013.01); *H01L 2224/16238* (2013.01); *H01L 2224/2741* (2013.01); *H01L 2224/32225* (2013.01); *H01L 2224/73104* (2013.01); *H01L 2224/73204* (2013.01); *H01L 2224/814* (2013.01); *H01L 2224/8113* (2013.01); *H01L 2224/81132* (2013.01); *H01L 2224/81192* (2013.01); *H01L 2224/81193* (2013.01); *H01L 2224/81203* (2013.01); *H01L 2224/81801* (2013.01); *H01L 2224/81815* (2013.01); *H01L 2224/83192* (2013.01); *H01L 2224/83856* (2013.01); *H01L 2224/9211* (2013.01); *H01L 2224/94* (2013.01); *H01L 2924/01029* (2013.01); *H01L 2924/10253* (2013.01); *H01L 2924/1461* (2013.01)

(56) References Cited

U.S. PATENT DOCUMENTS

| | | | | |
|---|---|---|---|---|
| 6,919,420 | B2* | 7/2005 | Buchwalter et al. | 528/230 |
| 6,975,036 | B2* | 12/2005 | Ohuchi | 257/778 |
| 7,109,061 | B2* | 9/2006 | Crane et al. | 438/118 |
| 7,253,078 | B1* | 8/2007 | Nguyen et al. | 438/411 |

* cited by examiner

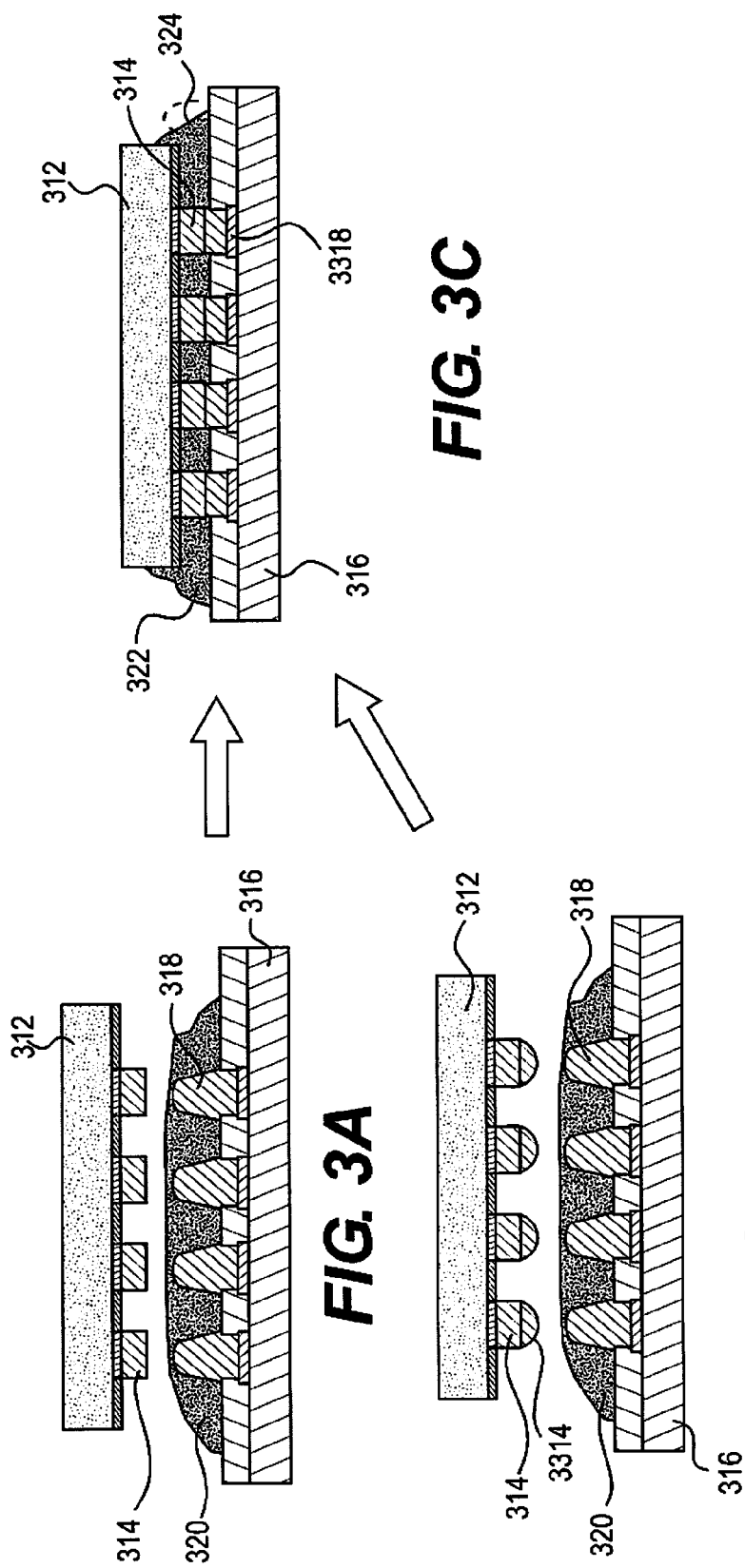

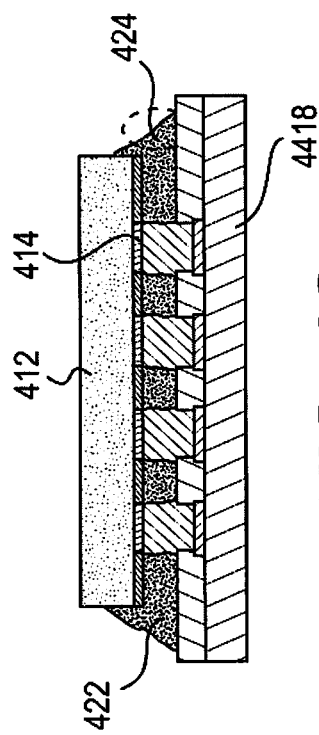
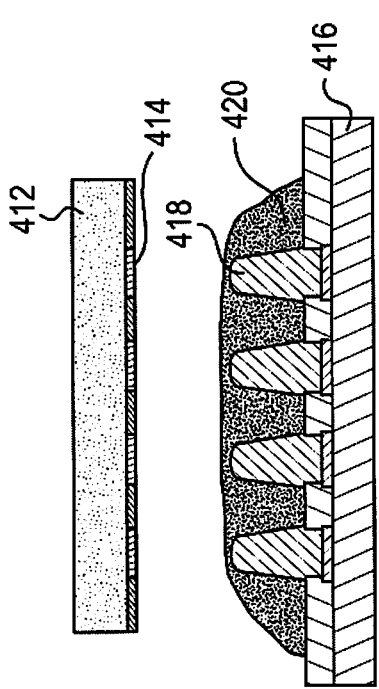
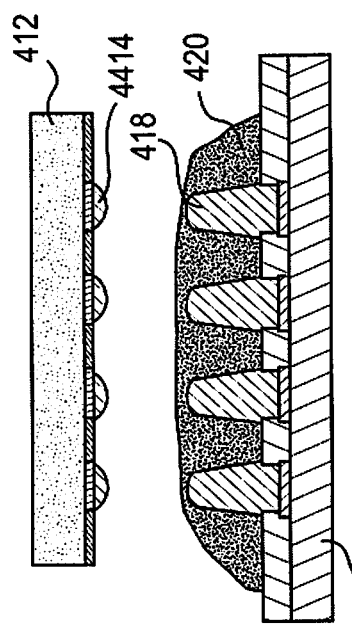
FIG. 4C
FIG. 4A
FIG. 4B

NO FLOW UNDERFILL OR WAFER LEVEL UNDERFILL AND SOLDER COLUMNS

RELATED APPLICATIONS

The present application is a Divisional Application of Parent U.S. patent application Ser. No. 13/231,594 filed Sep. 9, 2011, incorporated herein by reference in its entirety.

FIELD OF THE INVENTION

This invention relates to semiconductor packaging and, particularly, to flip chip inter connection.

BACKGROUND OF THE INVENTION AND RELATED ART

Background of the Invention

Flip chip technology is the name of a process in which a semiconductor chip is flipped over so that the active side with the connection pads faces towards the substrate. In a high volume manufacturing process. Alignment marks on the chip and the fiducial marks on the substrates are used for the fast automatic alignment between the chip and the substrate using a flip chip tool.

Flip chip technology is the fastest growing chip interconnect technology as it allows the largest numbers of input/outputs (I/Os) for the smallest footprint of the chip. This allows small packages including packages such as chip-scale packages.

Gruber et al. in their paper "Low-cost wafer bumping," *IBM Journal of Research and Development*, IBM JRD 49-4/5 (http://www.research.ibm.com/jpournal/rd/494/gruber.html) (Aug. 16, 2005) describe flip-chip solder-bump interconnections as the face-down soldering of integrated circuit (IC) devices to chip carriers by means of conductive bumps on the chip bond pad. The use of this bump technology also extends to passive filters, detector arrays and MEMs devices. IBM introduced this technology in the early 1960's with the solid logic technology in the IBM System/360™. It extended interconnection capabilities beyond existing wire-bonding techniques, allowing the area array solder-bump configuration to extend over the entire surface of the chip (die) providing solder bumps for interconnection to a substrate by the C4 (controlled collapse chip connection) solder reflow process developed by IBM. This allowed for the highest possible I/O counts to meet the increasing demand for electrical functionality and reliability in IC technology.

The original wafer-bumping process of metal mask evaporation in which ball-limiting metallurgy (BLM) also known as under board metallization, or under mask metallization, or under mask-bump metallurgy (UBM) involve the evaporation onto a wafer surface of solder through mask openings in an area array fashion. The need for increased I/O density and count, and pressures to lower the cost of flip-chip interconnections have spurred the development of other wafer bumping techniques such as electroplating or stencil-printing/paste-screening (solder paste) bump processes. Some of the more newly developed bumping processes include transfer printing, solder jetting, and bumpless and conductive particle applications.

In its broader aspect, BLM, or UBM comprises the application of a metal coating to the die contact pads such as aluminum or copper contact pads, where the metal coating provides a surface that can adhere to solder. One process involves cleaning an aluminum terminal pad followed by activation to remove any aluminum oxide layer on the pad and applying a thin layer of zinc by means of a single or double zincate coating. By following this coating with an electroless Ni (P) plating process the zinc is replaced with nickel which forms a strong bond between the nickel and aluminum. Manufacturers use a similar process for a copper terminal pad with the exception that they clean the pad first with a dilute etchant, followed by activation with a palladium dispersion or solution and then apply the electroless Ni (P) film, or alternatively an electrolytic or sputtered Ni (V) film. Subsequent steps involve application of solder, e.g., solder "bumps" to the metal coating. Gruber et al. (supra) give a detailed explanation of all of the foregoing processes.

The so-called "solder bumps" provide a space between the chip and the substrate after flip chip assembly, usually filled in the last steps of the assembly process with a nonconductive "underfill" material that adhesively joins the entire surfaces of the chip and the substrate. The underfill not only blocks other contaminants from entering into the structure but also locks the chip and substrate to one another so that differences in thermal expansion do not break or damage the electrical connections of the bumps.

In one embodiment we provide a process of manufacturing a semiconductor device comprising; a) forming a chip comprising chip soldering structures; b) forming a substrate comprising substrate soldering structures corresponding to the chip soldering structures and that extend to and for forming solder connections with the chip soldering structures, the height of the chip soldering structures being greater than the height of the substrate soldering structures; c) forming a pre-applied underfill contiguous with the chip the pre-applied underfill being sufficiently thick so as to extend up to, and substantially no further than the full height of the chip soldering structures; d) curing the underfill to a B-stage underfill to provide a chip coated with the B-stage underfill; e) soldering the chip coated with the B-stage underfill to the substrate through the chip soldering structures and the substrate soldering structures; wherein the chip soldering structures and the substrate soldering structures may comprise solderable metal columns with height-to-diameter ratios of greater than about 1.5:1 up to about 5:1 aligned with a solderable surface, whereby the processing window in the flip chip assembly process is broadened.

In further embodiments, the chip soldering structures may comprise metal column connectors, solder column connectors; at least one of the chip soldering structures and the substrate soldering structures may be selected from solder columns; at least one of the chip soldering structures and the substrate soldering structures may be selected from electroplated solder connectors; at least one of the chip soldering structures and the substrate soldering structures may be selected from solder capped BLM pads; at least one of the chip soldering structures and the substrate soldering structures may be selected from solder capped metal pillars; at least one of the chip soldering structures and the substrate soldering structures may be selected from solder capped metal posts; at least one of the chip soldering structures and the substrate soldering structures may be selected from solder capped metal columns.

In another embodiment, we provide a process of manufacturing a semiconductor device comprising; a) forming a chip comprising chip soldering structures; b) forming a substrate comprising substrate soldering structures corresponding to the chip soldering structures and that extend to and for forming solder connections with the chip soldering structures, the height of the substrate soldering structures being greater than the height of the chip soldering structures; c) forming a pre-applied underfill contiguous with the substrate, the pre-applied underfill being sufficiently thick so as to extend up to, and substantially no further than the full height of the substrate soldering structures; e) curing the underfill to a B-stage underfill to provide a substrate coated with the B-stage underfill; f) soldering the substrate coated with the B-stage underfill to the chip through the chip soldering structures and the substrate soldering structures; wherein the chip soldering structures and the substrate soldering structures may comprise solderable metal columns with height-to-diameter ratios of greater than about 1.5:1 up to about 5:1 aligned with a solderable surface, whereby the processing window in the flip chip assembly process is broadened.

In the process of paragraph [0070.3], the pre-applied underfill may partially or substanlially covers at least one of the substrate soldering structures on the substrate; the substrate soldering structures may comprise metal column connectors; the substrate soldering structures may comprise solder column connectors; at least one of the chip soldering structures and the substrate soldering structures may be selected from solder bumps; at least one of the chip soldering structures and the substrate soldering structures may be selected from solder columns; at least one of the chip soldering structures and the substrate soldering structures may be selected from electroplated solder connectors; the chip soldering structures may be selected from solder capped BLM pads; at least one of the chip soldering structures and the substrate soldering structures may be selected from solder capped metal pillars; the substrate soldering structures may be selected from solder capped metal posts; the substrate soldering structures may be selected from solder capped metal columns; and the pre-applied underfill may partially or substantially covers at least one of the substrate soldering structures on the substrate.

New solder-bumping technologies have developed that include some of the attributes of plating (extendibility to larger wafers and smaller bump size/pitch) and solder paste screening (flexibility of Pb-free alloy selection and low cost). One process comprises injection-molded solder (IMS) technology developed at IBM Research as an outgrowth of earlier work using solder for high performance thermal joints.

Industry nonetheless pressed for lower cost, higher quality bumping processes, and to this end IBM developed the C4NP (C4 new process, announced on Sep. 13, 2004) for IMS wafer bumping processes. Gruber et al. (supra) describe this process which basically involves processing a wafer and a solder mold simultaneously, but in separate processes that subsequently merge. Solder fills the mold in a prearranged pattern, after which the filled mold goes through an inspection step and alignment step with a wafer. Prior to alignment the wafer undergoes BLM deposition and patterning followed by inspection. After aligning mold and wafer the assembled components go through a reflow process to transfer solder to the wafer.

The overview of flip chip technology shows its major advantage lies in utilizing the total chip area to make the I/O connections, whereas wire bonding uses only the chip periphery. A disadvantage of flip chip technology is that stresses that arise from the thermal mismatch between the silicon (chip) thermal expansion coefficient (CTE) and the CTE of the substrate are borne fully by the solder bumps (C4s) used to make the interconnect between chip and substrate. As noted, in order to ameliorate the stresses flip chip packages are usually underlined, i.e., a resin is placed between the chip and the substrate and acts as encapsulant of the solder bumps and an adhesive between chip and substrate. The effect of such underfills is that the long-time reliability of underlined flip chip packages is greatly enhanced compared to counterparts without an underfill.

IBM invented the OBAR (Over Bump Applied Resin) method in which pre-applied underfill on the chip for flip chip assembly eliminates the stress induced failure of the back-end-of-line (BEOL) during the flip chip assembly process. However, when the underfill is pre-applied on the chip, the alignment between the chip bumps and the substrates pads (or pre-solder bumps on the substrate) is very difficult because the OBAR covers the alignment marks and bumps on the chip and they cannot be used for the alignment. Therefore, very good transparency of the OBAR material is needed for the successful flip chip assembly process.

In joining chip to laminate pads either with pre-applied underfill on the presoldered bumps on laminate pads or OBAR pre-applied underfill on the wafer (chip), the process window to achieve a successful joining structure is complicated because two totally different material systems, the solder and resin, need to work together and be compatible with each other. Optimization of the process parameters, such as temperature profile, ramp rate, forces, resin formulation that affect curing, and flow of pre-applied underfill, and the like, are all critical to determining the quality of the final joint. There are several wafer-level pre-applied underfill processes, among them the Wafer-level Underfill (WLUF) process which uses an over-bump wafer-applied resin, that is then B-staged, followed by dicing of the wafer to singulate chips and finally joining the chips with the WLUF layer to substrates. The WLUF process has been described by Buchwalter, Feger, Hougham, LaBianca, and Shobha, U.S. Pat. No. 6,919,420.

The WLUF process, however, has a few drawbacks such as the fact that the WLUF material must be applied to the full wafer before chip singulation. This requires wafer testing to identify bad chip sites and wafer-level burn in, if chip burn in is required before the chip is joined to the package. While these processes are possible, they require special tooling and thus add cost to the package.

Further, functioning and non-functioning (a.k.a. good and bad) chip sites are coated during the wafer-level underfill apply process. The materials and processing cost for the bad chip sites through singulation has to be added to the cost of making the good WLUF coated chips. This cost can be significant, if the yield of the wafer is low, i.e., at the beginning of a new program or for complex chips.

Additionally, application of the WLUF material to the wafer requires storage until the wafer can be diced and further storage until the WLUF coated chips can be joined to the package. This requires stability of wafer-applied WLUF material for up to 6 months and may require storage of such wafers under nitrogen or other special conditions.

The WLUF layer may also obscure the C4 pattern and/or other alignment marks making it difficult to align WLUF coated, diced chips to the substrate before joining. The WLUF in this regard may contain high pigment or filler loading in order to ameliorate the difference in the coefficient of thermal expansion (CTE) of the semiconductor chip and the circuit board joined to it but this has other consequences. Increased pigment or filler loading further opacifies the WLUF making it difficult to ascertain alignment features or markings on the board and/or chip.

While these obstacles can be overcome as described by Buchwalter et al. (infra) and, U.S. Pat. No. 6,919,420 (supra), it would be of great advantage, if a process could be developed that could be applied to a singulated chip prior to joining. This would be of particular advantage for multi-chip modules and CSP (chip-size package) applications.

Investigating the use of the OBAR WLUF process as a pre-applied underfill on a substrate over tall substrate bumps will aid in defining an optimized process window to achieve good joining. The present invention, however, broadens the process window so good solder joints and fillets, i.e., underfill that extends beyond the periphery of the substrate or chip, can be achieved more easily. The advantage of an OBAR pre-applied underfill on a substrate over the OBAR WLUF process is that the former does not affect chip burn-in and testing processes.

P. Gruber, P. Lauro, J. W. Nah, K. Toriyama, U.S. Pat. Pub. No. 2010/0116871 entitled "Injection Molded Solder Method for Forming Solder Bumps on Substrates" shows how the tall substrate bumps can be formed on a substrate.

Several methods are disclosed to see the alignment marks after applying OBAR on the wafer (US 2009/0102070 A1 and US 2008/0265445 A1) but these methods need additional process steps to remove the B-stage cured OBAR.

In the case of pre-applied underfill on a substrate, it can be dispensed only on the pre-solder bumps area on the substrate so there is no issue of automatic alignment by using the alignment marks on the chip and the fiducial marks on the substrate.

However, the underfill must be dispensed one substrate by one substrate just before assembling the flip chip which decreases the throughput. Also, the method of pre-applied underfill on a substrate may increase the filler inclusions because a thick pre-applied underfill should be dispensed due to the small height of the pre solder bumps on the substrate which is less than half of the height of the solder bumps on the chip.

Accordingly, to get the advantage of the pre applied underfill which eliminates the stress induced failure of the BEOL, it is generally desirable to have a new method for flip chip manufacturing with pre applied underfill which enables the fast automatic alignment for high throughput and a short distance of underfill through which the solder must be pushed so that filler inclusions inside the interconnections can be minimized or eliminated.

Related Art

The following references comprise related art teachings:
C. Feger, N. LaBianca, M. Gaynes, S. Steen, "The Over-Bump Applied Resin Wafer-Level Underfill Process: Process, Material and Reliability," IBM Research Report, RC24851 (WO908-142) Aug. 31, 2009
S. Buchwalter, C. Feger, G. Hougham, N. LaBianca, and H. Shobha, U.S. Pat. No. 6,919,420.
S. L. Buchwalter, D. Danovitch, F. E. Doany, P. A. Gruber, R. Iyengar, N. C. LaBianca, U.S. Pat. No. 6,924,171.
C. Feger, N. C. LaBianca, G. Hougham, H. K. Shobha, and S. L. Buchwalter, "A Wafer-level Underfill Process for Flip-chip Packaging," Proc. IMAPS Flip Chip Tech. 2003 (Feger et al.).
R. Mahidhara, "Comparing Chip-Scale Packaging to Direct Chip Attach," Chip Scale, May-June, 1999
L. Crane, D. Gamota, R. W. Johnson, and P. Neathway, "Making Direct Chip Attach Transparent to Surface Mount Technology," Chip Scale, September-October, 1999 B. Ma, E. Zhang, S. H. Hong, Q. Tong and A. Savoca, "Material Challenges for Wafer Level Packaging", Proc. Int. Symp. on Adv. Packag. Materials Processes, Properties and Interfaces P. 68, 2000.

SUMMARY OF THE INVENTION

The present invention provides such processes that address these needs to not only provide advantages over the related art, but also to substantially obviate one or more of the foregoing and other limitations and disadvantages of the related art. The written description, claims, abstract of the disclosure, and the drawings, that follow set forth various features, objectives and advantages of the invention and how they may be realized and obtained. They will also become apparent by practicing the invention.

To achieve these and other advantages, and in accordance with the purpose of the invention as embodied and broadly described herein, the invention comprises a C4 process that includes the formation of columnar solder bumps, such as injection molded columnar solder bumps or by electroplating processes to produce these columns on a substrate and/or chip followed by the application of a pre-applied underfill on the substrate or chip for easy automatic alignment of chip and wafer in the C4 process. Equivalents of the columnar solder bumps include metal columns, with or without solder caps, such as Cu columns. The process substantially minimizes or eliminates the underfill inclusion by minimizing the over bumped amount of the pre-applied underfill. The invention also includes articles of manufacture made by these processes.

In describing the present invention we refer to "B-"staged underfill material which is highly viscous (at RT actually a solid) and will only flow under pressure at an elevated temperature. For the process described here, the viscosity might be lowered to avoid the use of a heated substrate but heating is ultimately required to melt the solder, so the softening point of the resin may be less critical.

"B-staging" is a broad term in the field. We use it to describe processing the resin used in accord with the invention in which the resin viscosity has been adjusted by combining the resin with a solvent. B-staging typically means "drying, or driving out solvent, while advancing the network formation reaction of the resin insignificantly" and we employ the term in the same way. For the wafer-applied OBAR process, B-staging must be done before dicing, and similar processes. For the process described here, B-staging may or may not be needed depending on the resin composition selected. All that matters is that the resin can be applied over the bumps without air pockets/voids. Lower viscosity will aid that and solvents are often used to achieve a lower viscosity.

BRIEF DESCRIPTION OF THE DRAWINGS

The accompanying Figures, together with the detailed description serve to further illustrate various embodiments and to explain various principles and advantages of the present invention. These Figures are not drawn to scale but present the various aspects of the invention in a way to provide a further understanding of the process and article of manufacture described herein.

FIGS. 3A-3C comprise side elevations in cross-section illustrating the present invention's flip chip assembly using the combination of injection molded solder bumps and OBAR underfill on the substrate to minimize the filled resin layer through which the solder must travel during the joining process where the chips have copper pillar bumps (FIG. 3A) or copper pillar bumps with solder caps (FIG. 3B).

FIGS. 4A-4C comprise side elevations in cross-section illustrating the present invention's flip chip assembly using the combination of injection molded solder bumps and OBAR underfill on the substrate to minimize the over bumped amount of the OBAR underfill where the chips only have BLM (Bump Limited Metallurgy) (FIG. 4A) or a small volume solder bumps (FIG. 4B).

DETAILED DESCRIPTION OF THE INVENTION

Figure 1B:
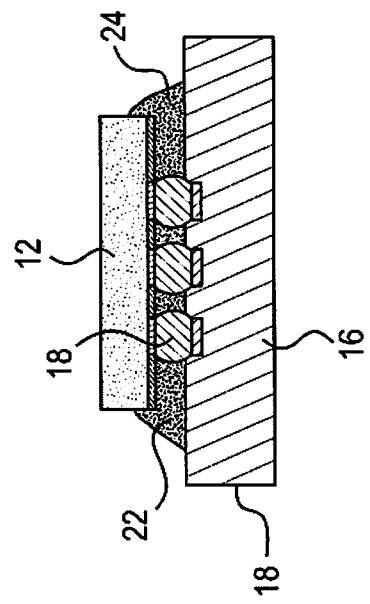
FIGS. 1A and 1B comprise side elevations in cross-section illustrating a prior art flip chip process of joining a chip and a substrate with a pre-applied underfill on a substrate.

In order to broaden the processing window when joining chip to the laminate, we use solder columns (including tapered solder columns) or metal columns, which includes solder capped metal columns with height-to-diameter ratios of greater than about 1.5:1 and up to about 5:1 on either an OBAR in the substrate process or an OBAR WLUF in the chip or wafer process.

The height of the solder columns or metal columns (including solder capped metal columns) may be anywhere from about 1 micron to about 200 microns.

For the purpose of this invention we designate the solder columns or metal columns (including solder capped metal columns) on the substrate as "substrate soldering structures" and solder columns or metal columns (including solder capped metal columns) on the chip as "chip soldering structures." In one embodiment, the height of the substrate soldering structures on a substrate is greater than the height of the chip soldering structures on a chip, In another embodiment, the height of the chip soldering structures on a chip is greater than the height of the substrate soldering structures on a substrate. "Greater" in the regard means from about 1.5 times to about 5 times greater.

In one particular embodiment of the invention, we employ a process where the height of the substrate soldering structures is greater than the height of the chip soldering structures.

As in the prior art OBAR WLUF process the OBAR layer thickness above the bumps is carefully chosen to (a) make the layer thin enough to reduce the amount of resin that the solder or interconnect metal needs to push through to make a connection to form an electrical connection and (b) to have enough underfill resin available to fill the gap between chip and substrate sufficiently. A thinner OBAR layer, e.g., underfill layer on the columns, facilitates the solder joining process. In addition the taller columns provide a sufficient gap between chip and substrate allowing adequate resin or underfill materials to fill the gap when the solder collapses after joining.

These columns can be used on either side of the joint (chip or laminate, i.e., substrate, respectively) with the side containing said columns coated with the OBAR WLUF or OBAR on substrate. As is known in the art the side not containing the column must contain a metal structure capable of making a metal joint for electrical connection. The solder columns on substrate pads can be formed using the IMS bumping method, precoated with OBAR on substrate, then joined to a standard UBM pad on the chip with or without solder. The OBAR layer covering the column is preferred to be thin to facilitate pushing through it without any entrapment of underfill and/or filler at the interface.

For the solder columns on the chip side, both C4NP processes and C4 plating processes can create solder columns. For C4NP, an anisotropic etched glass mold has been shown to produce column shaped cavities. The C4 plating through thick photoresist (up to 200 microns thick) can plate columns before resist stripping and reflow. By adjusting the plating parameters the height to diameter ratio can be further enhanced. Metal columns may be placed on the chip in a manner well known in the art.

P. Gruber, P. Lauro, J. W. Nah, K. Toriyama, U.S. Pat. Pub. No. 2010/0116871., which is commonly owned by International Business Machines Corporation, discloses a method and apparatus for forming solder bumps on organic substrates, whereby molten solder is injected into a mask which is aligned on a substrate (the "IMS" method). The injection molded solder bumping method can form very tall bumps on the substrate. As stated before, we employ the IMS method in some embodiments of the invention When the IMS method is used and the pre-solder bumps on the substrate have sufficient height, the thickness of the pre-applied underfill can be substantially the same, i.e., about the same height, or slightly higher or slightly lower than that of the pre-solder bumps on the substrate in order to improve the assembly yield by reducing the amount of underfill that needs to be pushed away during the chip bonding process.

In addition the taller solder bump or metal column provides a sufficient gap between chip and substrate allowing sufficient resin or underfill materials to fill the gap between chip and substrate when the solder column or other solder connectors in the assembly collapse after joining.

The terminal ends of the substrate soldering structures and the chip soldering structures may both be substantially round or one may be substantially flat and the other substantially round. In one embodiment of the invention the terminal end of the substrate soldering structure is substantially flat and the terminal end of the chip soldering structure is substantially round.

Underfills that are pre-applied to the substrate are no-flow underfills. However, in typical no-flow underfill processes, the underfill must be dispensed one substrate by one substrate just before the flip chip assembly. To increase the throughput and uniform thickness of the pre applied underfill on the substrate, an OBAR underfill could be applied on the C4 area of the substrate side by using a printing method.

In a further embodiment, the OBAR underfill can be applied successively in local areas on the substrate surfaces where the properties of the local areas are selected to enhance reliability of the solder joints and chip and substrate structures.

As noted, the column shaped bumps minimize the over bump amount of the pre applied underfill that can be formed on the substrate side.

In yet another embodiment, solder columns can be used on either or both sides of the joint.

Figure 1A:
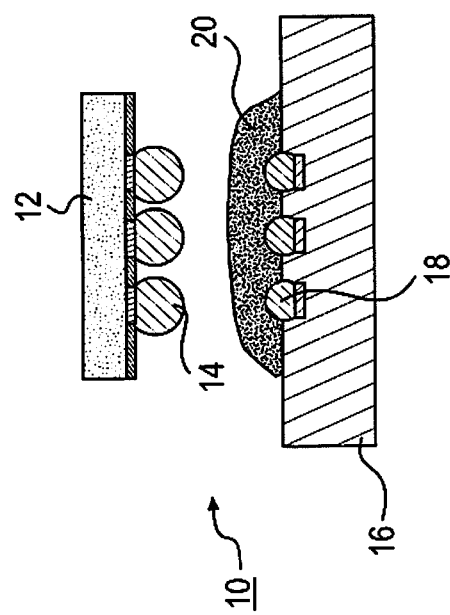

FIG. 1A illustrates a prior art C4 preassembly 10 comprising chip 12, substrate 16, C4 solder bumps 14 on chip 12, presolder bumps 18 on substrate 16, and no flow underfill 20 on substrate 16. FIG. 2B shows a structure obtained by thermal compression of C4 preassembly 10 to bond chip 12 to substrate 16 by heat flowing solder bumps 14 on chip 12 and presolder bumps 18 on substrate 16 so they flow into one another and that further results in compression of no flow underfill 20 to a compressed underfill 22 and the formation of a fillet 24 which is an expansion of the no flow underfill 20 beyond the perimeters of the chip 12 and the substrate 16.

The process requires a sufficient amount of underfill to produce a fillet large enough to assure substantially complete coverage of and proper bonding of the entire surface of chip 12 to substantially the entire surface of substrate 16. If the underfill is too thick, excessive underfill can get trapped between the solder connections resulting in a flawed solder joint.

FIG. (2a), FIG. (2b), and FIG. (2c) comprise illustrations of a C4 chip pre-assembly according to the present invention whereas FIG. (2d) comprises an illustration of an assembled C4 chip of the invention.

Figure 2A:
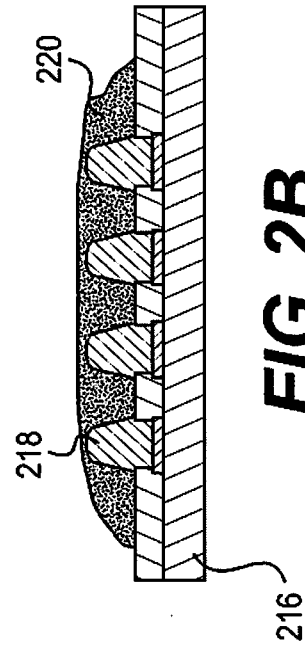
FIGS. 2A-2D comprise side elevations in cross-section illustrating the present invention's flip chip assembly using the combination of injection molded solder bumps and OBAR underfill on the substrate with tall bumps to minimize the filled resin layer through which the solder must travel during the joining process.
Figure 2C:
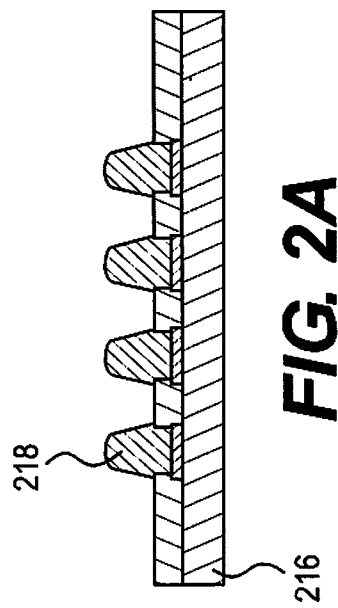
Figure 2B:
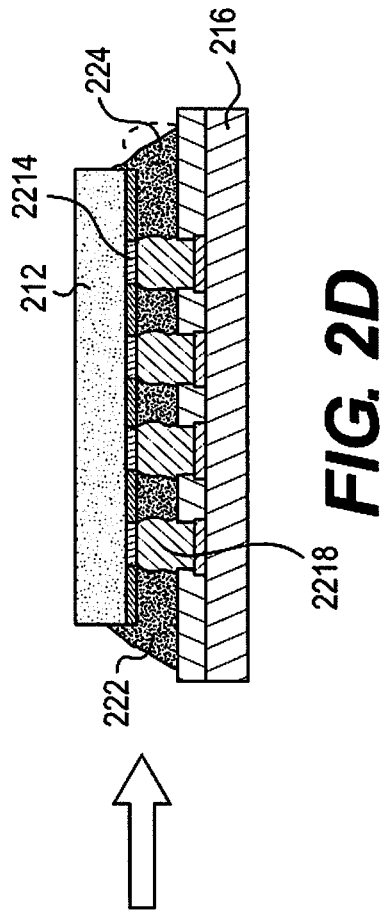
Figure 2D:
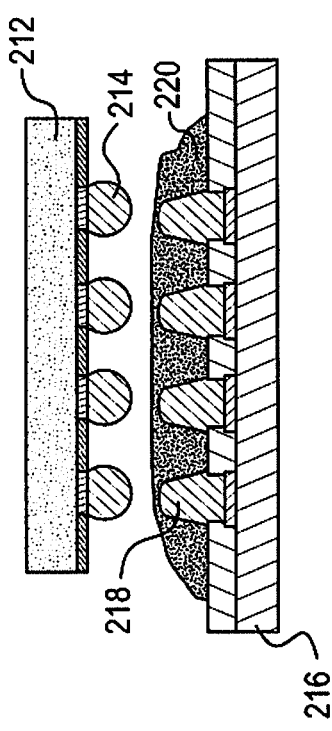

FIG. 2A illustrates a substrate 216 with IMS column solder bumps 218 on substrate 216, whereas FIG. 2B shows the application of a pre-applied underfill 220 at a thickness that substantially corresponds to the height of solder columns 218. FIG. 2C illustrates the alignment of C4 solder bumps 214 on chip 212 with the IMS column solder bumps 218. Thermal compression of the preassembly of FIG. 2C results in the structure of FIG. 2D wherein the C4 solder bumps 214 and IMS column solder bumps 218 flow and fuse into one another to form a solder connection illustrated by collapsed C4 solder bumps 2214 and collapsed IMS column solder bumps 2218. Thermal compression also results in the compression of the underfill to a structure illustrated as 222 and formation of fillet 224.

Employing this process provides several advantages, including without limitation, better assembly yield of the final device because a smaller amount of underfill is pushed away from the top of the IMS column solder bumps (218); the melting of solder decreases the gap between the chip and the substrate and forms enough fillet for higher reliability of the assembled structure. The IMS bumps do not contain voids from flux as do bumps obtained through the conventional solder paste bumping methods; thus solder voiding will not contribute to void formation.

FIG. 3A illustrates a preassembly substrate 316 with IMS column solder bumps 318 on substrate 316 and a pre-applied underfill 320 at a thickness that substantially corresponds to the height of solder columns 318. Chip 312 is positioned over substrate 316 to align Cu pillars 314 positioned on chip 312 over IMS column solder bumps 318. FIG. 3B also illustrates a preassembly substrate similar to the structure of FIG. 3A, however, employs Cu pillars 314 having solder caps 3314 on chip 312 over IMS column solder bumps 318. Thermal compression of the preassembly of FIG. 2A and FIG. 2B results in the structure of FIG. 2D wherein the Cu pillars or solder capped Cu pillars 314/3314 and IMS column solder bumps 318 flow and connect to one another to form a solder connection illustrated by collapsed IMS column solder bumps 3318. Thermal compression also results in the formation of fillet 324.

By forming IMS bumps 318 on the substrate 316, the height of the Cu pillars on chip 312 can be reduced. This leads to low wafer bumping costs and less stress on the BEOL during assembly as well as higher assembly yields due to less push away of the underfill.

FIG. 4A illustrates a preassembly substrate 416 with IMS column solder bumps 418 on substrate 416 and a pre-applied underfill 420 at a thickness that substantially corresponds to the height of solder columns 418. Chip 412 is positioned over substrate 416 to align BLM pads 414 positioned on chip 412 over IMS column solder bumps 418. FIG. 4B also illustrates a preassembly substrate similar to the structure of FIG. 4A, however, employs small C4 solder bumps 4414 on chip 412 over IMS column solder bumps 418. Thermal compression of the preassembly of FIG. 4(a) and FIG. 4B results in the structure of FIG. 4C wherein the BLM pads 414 Cu or small C4 solder bumps 4414 connect to one another to form a solder connection illustrated by collapsed IMS column solder bumps 4418. Thermal compression also results in the formation of fillet 424.

By forming IMS bumps 418 on the substrate 416, and BLM's 414 or very small solder bumps 4414 on chip 412, the height of the C4 solder bumps 4414 on chip 412 can be reduced. This leads to low wafer bumping costs as well as higher assembly yields due to less push away of the underfill.

Figure 5B:
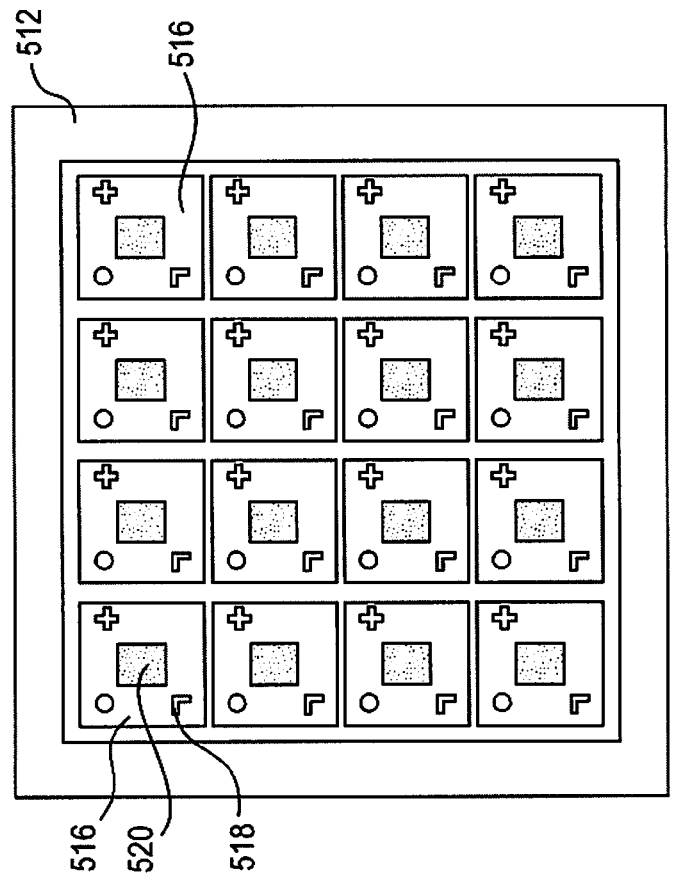
FIGS. 5A-H, comprise plan views illustrating a further process of the present invention of forming OBAR underfill layers on the C4 areas of a panel sized substrate; here low viscosity OBAR underfill is applied on the C4 areas of the panel by printing through a mask having large holes for the C4 areas. If the OBAR underfill is solvent-based, the resin is B-stage cured to remove the solvent and achieve a tack-free solid, and the panel is singulated into individual substrates.
Figure 5A:
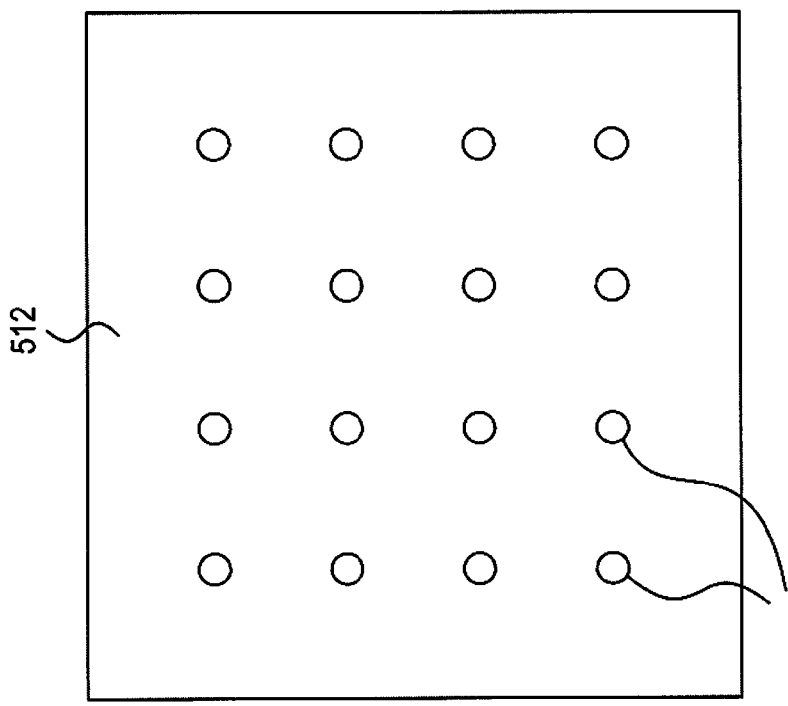
Figure 5D:
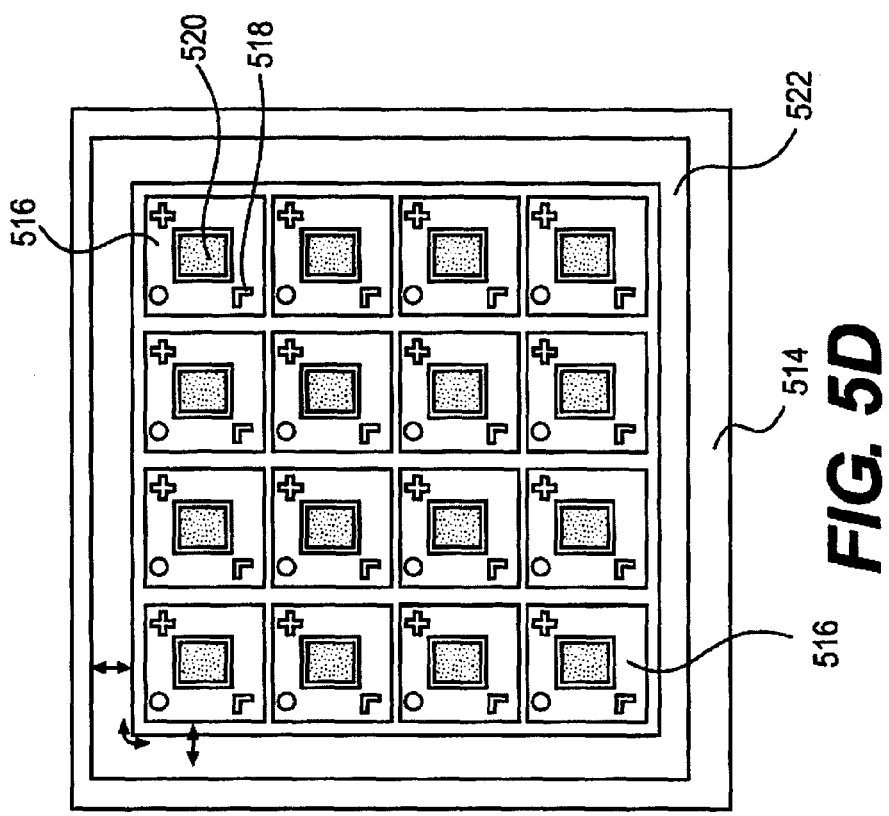
Figure 5C:
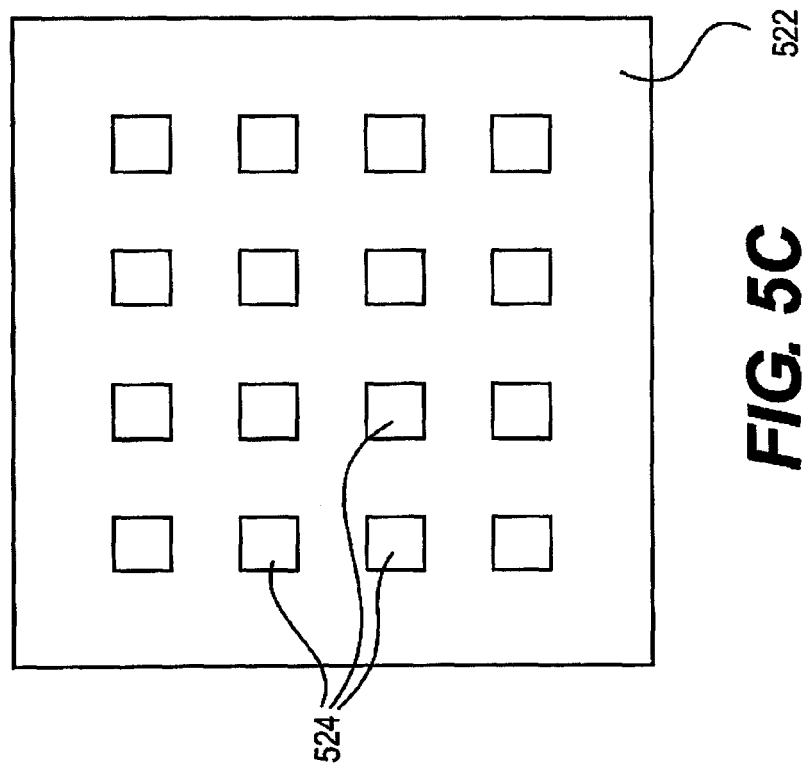
Figure 5F:
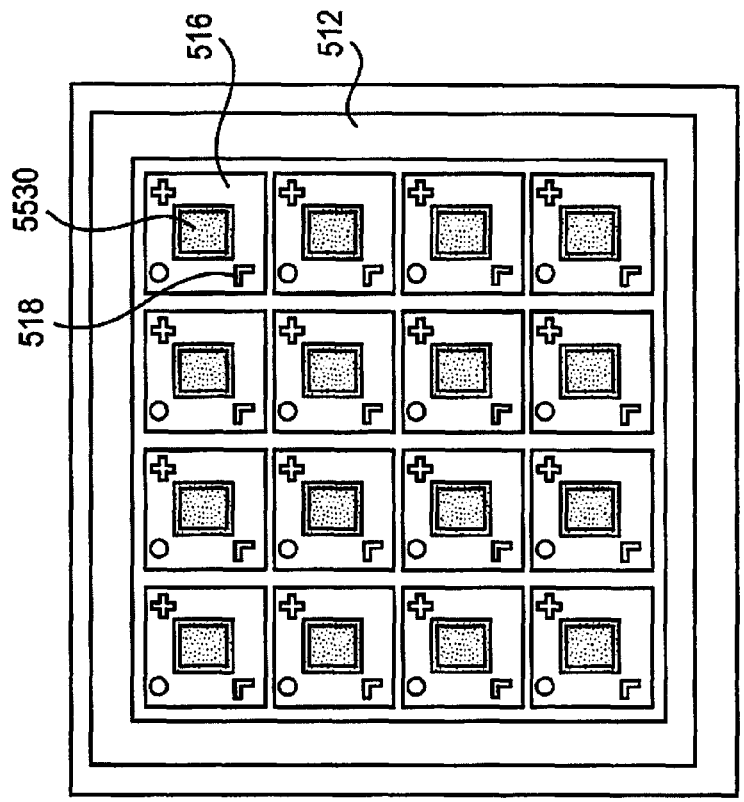
Figure 5E:
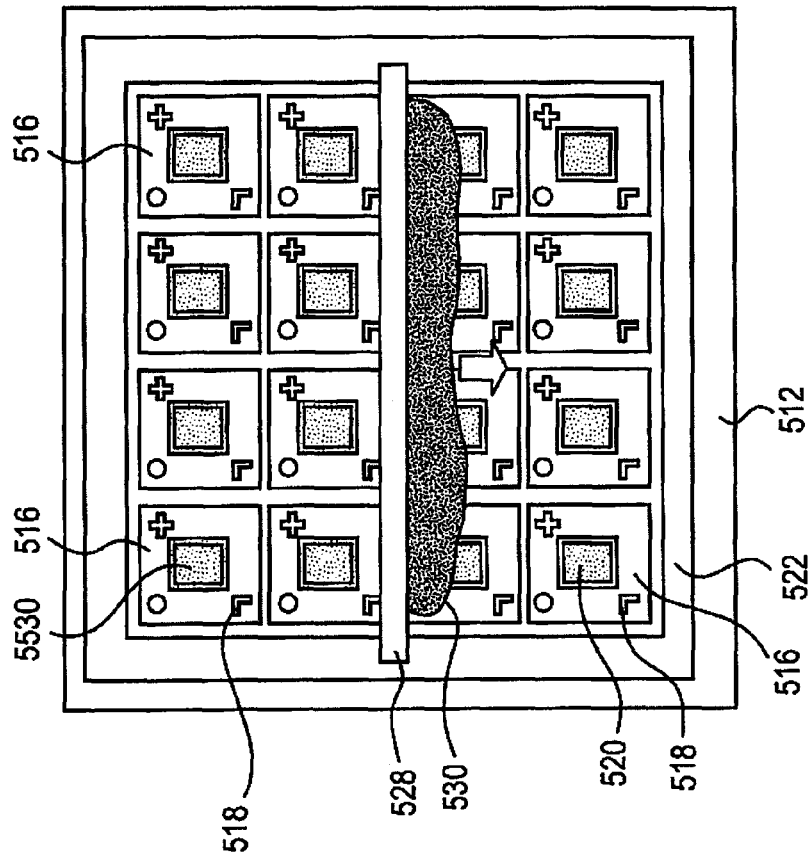
Figure 5H:
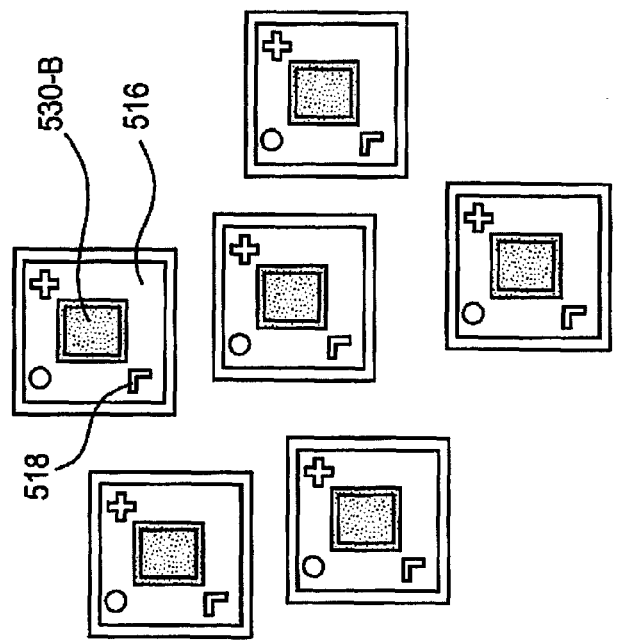

FIGS. 5A-5G comprise illustrations of various substrate preassemblies of a device of the invention, and FIG. 5H comprises an illustration of a singulated substrate of the invention. FIG. 5A comprises an illustration of a base plate 512 with vacuum holes 514; FIG. 5B, sheet type substrates on base plate 512 with repeating substrates 516, C4 IMS solder columns 520 as described herein, arranged in C4 patterns, and fiducial marks 518; since there are many vacuum holes 514 in base plate 512, individually singulated substrates may be used instead of sheet type substrates.

Figure 5G:
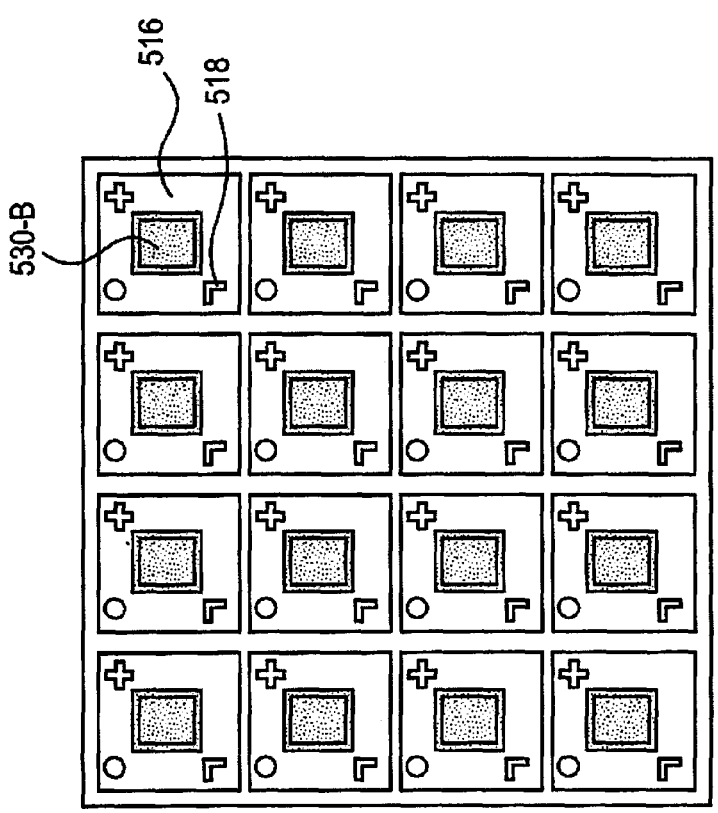

FIG. 5C illustrates mask 522 with repeating through holes 524 where the mask is made of metal, a polymer such as a polyimide, a ceramic and their art-known equivalents; FIG. 5D, alignment between mask 522 and the sheet type substrates (or arrayed singulated substrates) of FIG. 5B where the C4 patterns or areas 520 are exposed by the through holes 524, but the fiducial marks 518 are covered by the mask 522, thereby providing very easy alignment between the mask 522 and the panel-size repeating substrates (or arrayed singulated substrates) 516; FIG. 5E illustrating application of an underfill 530 to the structure of FIG. 5D to provide a pre-applied underfill coating 5530 on IMS solder columns 520, underfill 530 being leveled by means of a doctor blade 528 to a substantially uniform thickness which is also substantially the height of C4 IMS solder columns 520, removing the mask 522 from the structure illustrated in FIG. 5E produces the structure illustrated in FIG. 5F where the mask 522 is removed to reveal the pre-applied underfill 5530 covers only the C4 area comprising the IMS solder columns 520 as described herein, arranged in C4 patterns and wherein the fiducial marks 518 are not covered by the underfill 530; FIG. 5G where the base plate 512 is removed after conducting a B-stage cure of the under fill 5530 to produce a OBAR underfill 530-B; and FIG. 5H singulation of the substrate structure of FIG. 5G. In the case of using singulated substrates in FIG.

5B, the singulation step is not required. The B stage cured underfill 530-B is stable during the singulation process that divides the structure into individual substrates and protects the IMS solder columns 520 against oxidation.

Figure 6:
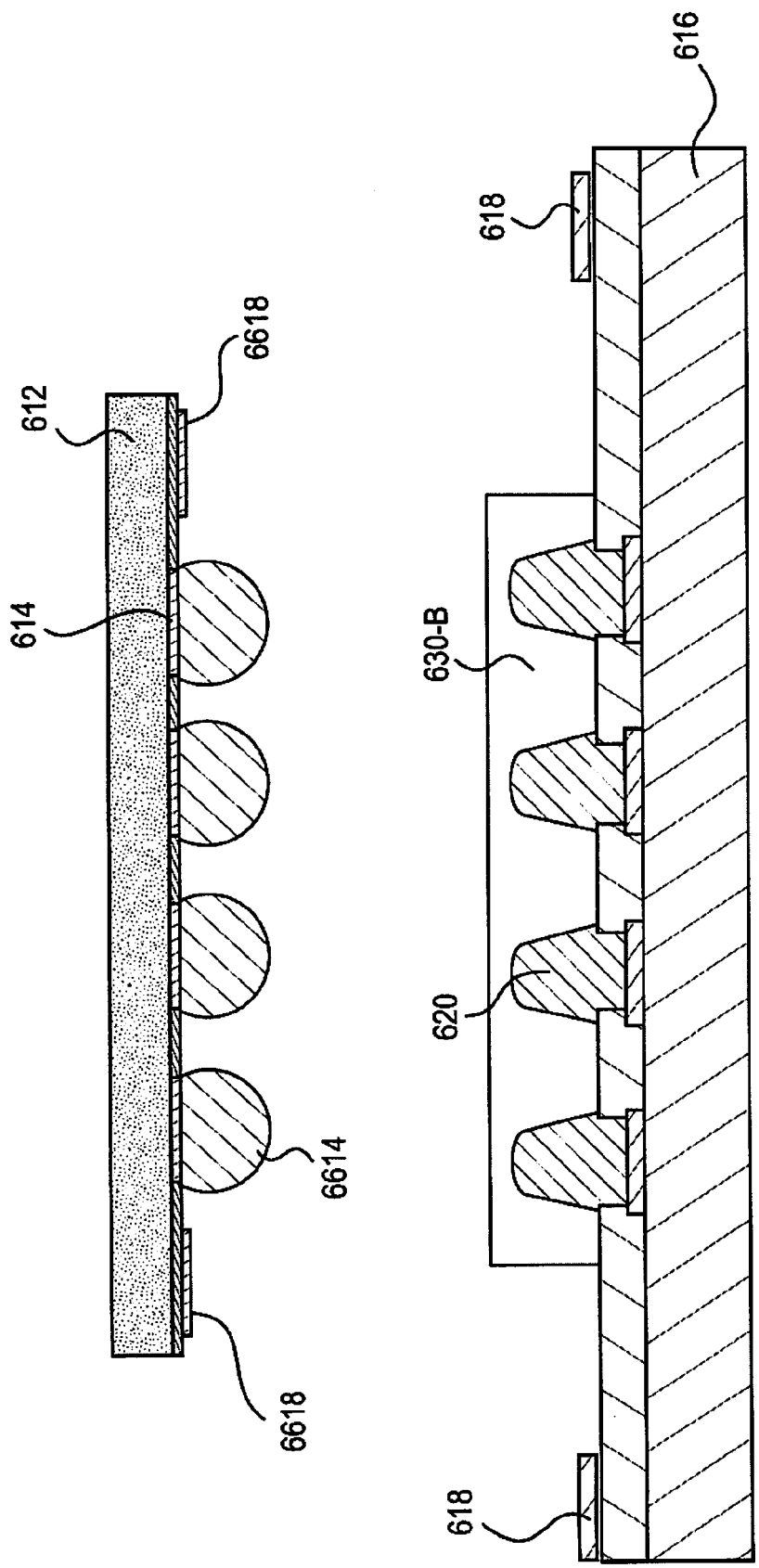
FIG. 6 comprises side elevations in cross-section illustrating the present invention's flip chip assembly to show the advantage of the OBAR resin underfill applied to the substrate side compared to the OBAR resin underfill applied to the chip side. The alignment marks on the die can be used for automatic alignment for flip chip assembly.

FIG. 6 comprises an illustration of the alignment between a chip and a substrate in accord with the invention. FIG. 6 illustrates a chip 612 having a C4 solder bump connector 6614 extending from UBM pads 614. Chip soldering structures 6614 can also comprise IMS solder columns, Cu pillars or solder capped Cu pillars. Alignment marks 6618 on chip 612 are employed to align chip 612 with substrate 616 through fiducial marks 618 on substrate 616. Solder columns 620 are enveloped by a B-stage cured pre-applied underfill 630-B that is substantially the same height as the solder columns 620. The structure of FIG. 6 allows for easy alignment of the chip 612 and the substrate 616 for the final flip chip assembly. The process of the invention provides a B-stage cured pre-applied underfill 630-B on the substrate 616 with substantially uniform thickness and minimum flow from the top of solder columns 620 on the substrate compared to the no-flow underfill systems of the prior art.

Figure 7:
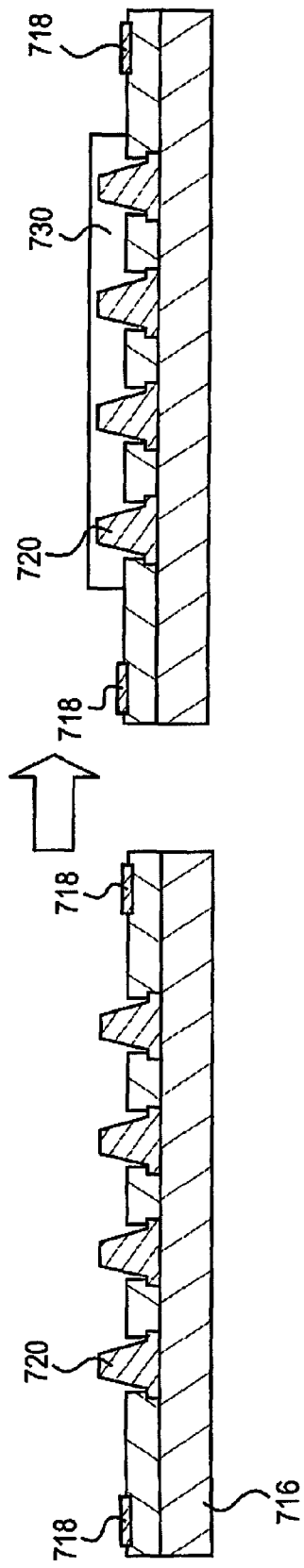
FIG. 7 and FIG. 8 comprise side elevations in cross-section showing the present invention's flip chip assembly to illustrate the alternatives of substrates with Cu post bumps (FIG. 7) or Cu post bumps with solder caps (FIG. 8) instead of the IMS bumps.

FIG. 7 comprises an illustration of the use of Cu posts on the substrate in lieu of or in addition to the use of IMS solder bumps as described above. Cu posts 720 are shown extending from substrate 716, substrate 716 also having alignment marks 718. Pre-applied underfill 730 envelops and is substantially the same height as Cu posts 720.

Figure 8:
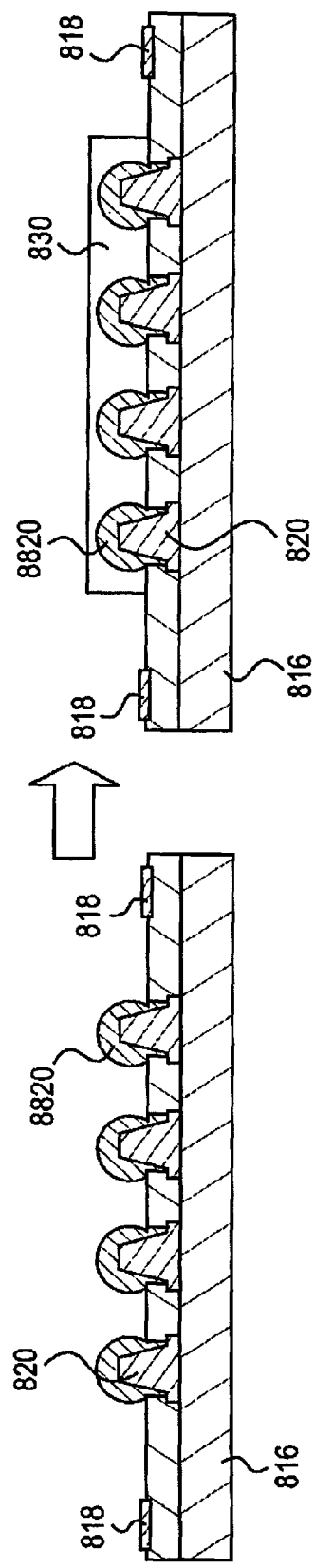
Figure 9A:
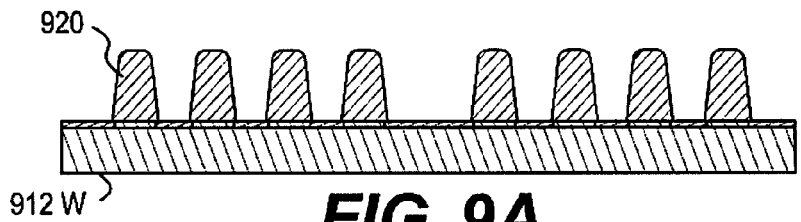
FIGS. 9A, 9B, 9C, and 9D comprise side elevations in cross-section illustrating the present invention's flip chip assembly where the column shaped bumps are formed on the chip side with OBAR underfill and wherein the OBAR underfill covers the column shaped bumps.
Figure 9B:
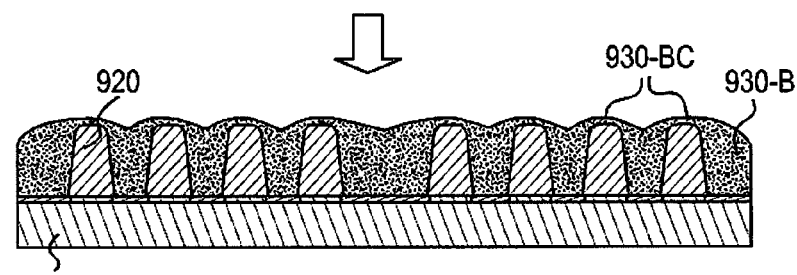
Figure 9C:
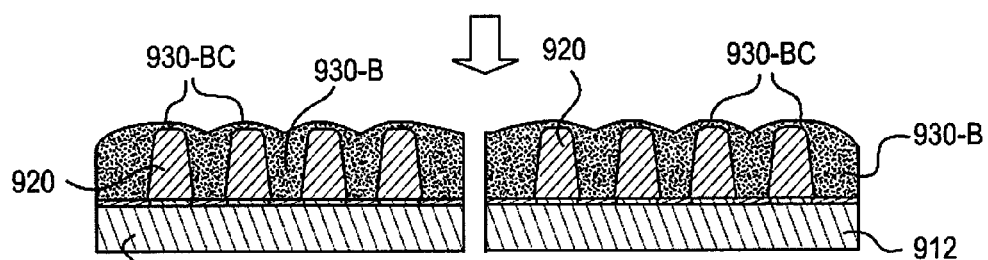
Figure 9D:
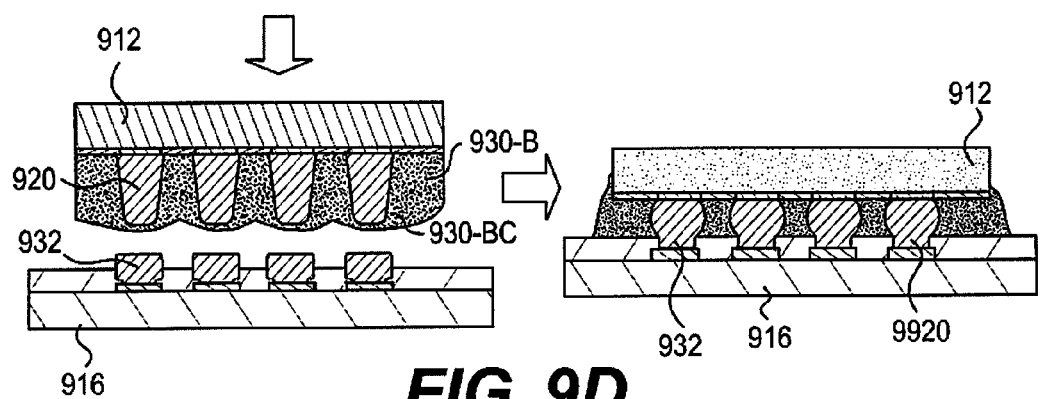

Similarly, FIG. 8 comprises an illustration of the use of Cu posts on the substrate in lieu of or in addition to the use of IMS solder bumps as described above. Cu posts 820 terminating in solder caps 820 are shown extending from substrate 816, substrate 816 also having alignment marks 818. Pre-applied underfill 830 envelops and is substantially the same height as Cu posts 820 and solder caps 8820.

FIG. 9A to FIG. 9D comprise illustrations of the use of C4 IMS solder columns 920 on a wafer 912-W, such as a silicon wafer to which we apply an underfill and cure it to the B-stage as described before to produce B-stage underfill 930-B, which is substantially the same height as C4 IMS solder columns 920. The underfill is applied in a way to produce B-stage underfill 930-BC on solder columns 920, underfill 930-BC being contiguous with and a part of B-stage underfill 930-B. Wafer 912-W is diced or singulated to form chips 912 which we join to substrate 916 by means of solder pads 932 on substrate 916 by means of a thermal compression bonding process to melt and solder columns 920 to solder pads 932. In the thermal compression bonding process, solder columns 920 become re-shaped and take on the configuration of solder masses 9920. The solder columns may also be applied to the wafer 912-W by electroplating in a manner well known in the art. By using solder column bumps on wafer 912-W the height of the underfill or OBAR on the wafer can be decreased. The foregoing process results in higher assembly yields due to less push away of the underfill or OBAR.

Underfill materials and processes are described by Feger and LaBianca in U.S. patent application Ser. No. 12/166,286; Cu or other metal posts or pillars by Nah and Shih in U.S. patent application Ser. No. 13/078,807 and tapered solder columns by Buchwalter, Gerber, Nah and Shih in U.S. patent application Ser. No. 11/869,573.

In summary, the invention, comprises chip soldering structures on a semiconductor chip; a substrate comprising substrate soldering structures corresponding to the chip soldering structures and that extend toward the chip soldering structures for forming solder connections with the chip soldering structures, the height of the substrate soldering structures being greater than the height of the chip soldering structures; a pre-applyable underfill contiguous with the substrate; wherein the underfill is sufficiently thick so as to extend substantially no further than the full height of the substrate soldering structures. In another embodiment the height of the chip soldering structures is greater than the height of the substrate soldering structures. The chip and the substrate are in preassembly positions relative to one another. A process comprises a method for manufacturing semiconductor assemblies from these devices by soldering the chip and the substrate to one another. We illustrate how and where the chip and the substrate are in preassembly positions relative to one another in FIGS. 2C, 3B, 3E, 4B, 6 and 9D.

In one embodiment we provide a process of manufacturing a semiconductor device comprising; a) forming a chip comprising chip soldering structures; b) forming a substrate comprising substrate soldering structures corresponding to the chip soldering structures and that extend to and for forming solder connections with the chip soldering structures, the height of the chip soldering structures being greater than the height of the substrate soldering structures; c) forming a pre-applied underfill contiguous with the chip the pre-applied underfill being sufficiently thick so as to extend up to, and substantially no further than the full height of the chip soldering structures; d) curing the underfill to a B-stage underfill to provide a chip coated with the B-stage underfill; e) soldering the chip coated with the B-stage underfill to the substrate through the chip soldering structures and the substrate soldering structures; wherein the chip soldering structures and the substrate soldering structures may comprise solderable metal columns with height-to-diameter ratios of greater than about 1.5:1 up to about 5:1 aligned with a solderable surface, whereby the processing window in the flip chip assembly process is broadened.

In further embodiments, the chip soldering structures may comprise metal column connectors, solder column connectors; at least one of the chip soldering structures and the substrate soldering structures may be selected from solder columns; at least one of the chip soldering structures and the substrate soldering structures may be selected from electroplated solder connectors; at least one of the chip soldering structures and the substrate soldering structures may be selected from solder capped BLM pads; at least one of the chip soldering structures and the substrate soldering structures may be selected from solder capped metal pillars; at least one of the chip soldering structures and the substrate soldering structures may be selected from solder capped metal posts; at least one of the chip soldering structures and the substrate soldering structures may be selected from solder capped metal columns.

In another embodiment, we provide a process of manufacturing a semiconductor device comprising; a) forming a chip comprising chip soldering structures; b) forming a substrate comprising substrate soldering structures corresponding to the chip soldering structures and that extend to and for forming solder connections with the chip soldering structures, the height of the substrate soldering structures being greater than the height of the chip soldering structures; c) forming a pre-applied underfill contiguous with the substrate, the pre-applied underfill being sufficiently thick so as to extend up to, and substantially no further than the full height of the substrate soldering structures; e) curing the underfill to a B-stage underfill to provide a substrate coated with the B-stage underfill; f) soldering the substrate coated with the B-stage underfill to the chip through the chip soldering structures and the substrate soldering structures; wherein the chip soldering structures and the substrate soldering structures may comprise solderable metal columns with height-to-diameter ratios of greater than about 1.5:1 up to about 5:1 aligned with a solderable surface, whereby the processing window in the flip chip assembly process is broadened.

In the process of paragraph (0070.3), the pre-applied underfill may partially or substantially covers at least one of the substrate soldering structures on the substrate; the substrate soldering structures may comprise metal column connectors; the substrate soldering structures may comprise solder column connectors; at least one of the chip soldering structures and the substrate soldering structures may be selected from solder bumps; at least one of the chip soldering structures and the substrate soldering structures may be selected from solder columns; at least one of the chip soldering structures and the substrate soldering structures may be selected from electroplated solder connectors; the chip soldering structures may be selected from solder capped BLM pads; at least one of the chip soldering structures and the substrate soldering structures may be selected from solder capped metal pillars; the substrate soldering structures may be selected from solder capped metal posts; the substrate soldering structures may be selected from solder capped metal columns; and the pre-applied underfill may partially or substantially covers at least one of the substrate soldering structures on the substrate.

Throughout this specification, abstract of the disclosure, and in the drawings the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be. We use the terms "method" and "process" interchangeably in this specification.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A process of manufacturing a semiconductor device comprising;
   a) forming a chip comprising chip soldering structures;
   b) forming a substrate comprising substrate soldering structures corresponding to said chip soldering structures and that extend to and for forming solder connections with said chip soldering structures, the height of said chip soldering structures being greater than the height of said substrate soldering structures;
   c) forming a pre-applied underfill contiguous with said chip said pre-applied underfill being sufficiently thick so as to extend up to, and substantially no further than the full height of said chip soldering structures;
   d) curing said underfill to a B-stage underfill to provide a chip coated with said B-stage underfill;
   e) soldering said chip coated with said B-stage underfill to said substrate through said chip soldering structures and said substrate soldering structures;
wherein said chip soldering structures and said substrate soldering structures comprise solderable metal columns with height-to-diameter ratios of greater than about 1.5:1 up to about 5:1 aligned with a solderable surface,
whereby the processing window in said flip chip assembly process is broadened.

2. A process of manufacturing a semiconductor device of claim 1 wherein said chip soldering structures comprise metal column connectors.

3. A process of manufacturing a semiconductor device of claim 1 wherein said chip soldering structures comprise solder column connectors.

4. The process of claim 1 wherein at least one of said chip soldering structures and said substrate soldering structures are selected from solder columns.

5. The process of claim 1 wherein at least one of said chip soldering structures and said substrate soldering structures are selected from electroplated solder connectors.

6. The process of claim 1 wherein at least one of said chip soldering structures and said substrate soldering structures are selected from solder capped BLM pads.

7. The process of claim 1 wherein at least one of said chip soldering structures and said substrate soldering structures are selected from solder capped metal pillars.

8. The process of claim 1 wherein at least one of said chip soldering structures and said substrate soldering structures are selected from solder capped metal posts.

9. The process of claim 1 wherein at least one of said chip soldering structures and said substrate soldering structures are selected from solder capped metal columns.

10. A process of manufacturing a semiconductor device comprising;
   a) forming a chip comprising chip soldering structures;
   b) forming a substrate comprising substrate soldering structures corresponding to said chip soldering structures and that extend to and for forming solder connections with said chip soldering structures, the height of said substrate soldering structures being greater than the height of said chip soldering structures;
   c) forming a pre-applied underfill contiguous with said substrate, said pre-applied underfill being sufficiently thick so as to extend up to, and substantially no further than the full height of said substrate soldering structures;
   e) curing said underfill to a B-stage underfill to provide a substrate coated with said B-stage underfill;
   f) soldering said substrate coated with said B-stage underfill to said chip through said chip soldering structures and said substrate soldering structures;
wherein said chip soldering structures and said substrate soldering structures comprise solderable metal columns with height-to-diameter ratios of greater than about 1.5:1 up to about 5:1 aligned with a solderable surface,
whereby the processing window in said flip chip assembly process is broadened.

11. The process of claim 10 wherein said pre-applied underfill partially or substantially covers at least one of said substrate soldering structures on said substrate.

12. A process of manufacturing a semiconductor device of claim 10 wherein said substrate soldering structures comprise metal column connectors.

13. A process of manufacturing a semiconductor device of claim 10 wherein said substrate soldering structures comprise solder column connectors.

14. The process of claim 10 wherein at least one of said chip soldering structures and said substrate soldering structures are selected from solder bumps.

15. The process of claim 10 wherein at least one of said chip soldering structures and said substrate soldering structures are selected from solder columns.

16. The process of claim 10 wherein at least one of said chip soldering structures and said substrate soldering structures are selected from electroplated solder connectors.

17. The process of claim 10 wherein said chip soldering structures are selected from solder capped BLM pads.

18. The process of claim 10 wherein at least one of said chip soldering structures and said substrate soldering structures are selected from solder capped metal pillars.

19. The process of claim 10 wherein said substrate soldering structures are selected from solder capped metal posts.

20. The process of claim 10 wherein said substrate soldering structures are selected from solder capped metal columns.

21. The process of claim 10 wherein said pre-applied underfill partially or substantially covers at least one of said substrate soldering structures on said substrate.

\* \* \* \* \*